(12) United States Patent
Hofmeister et al.

(10) Patent No.: US 9,196,518 B1
(45) Date of Patent: Nov. 24, 2015

(54) ADAPTIVE PLACEMENT SYSTEM AND METHOD

(71) Applicant: Persimmon Technologies, Corp., Wakefield, MA (US)

(72) Inventors: Christopher Hofmeister, Hampstead, NH (US); Martin Hosek, Lowell, MA (US)

(73) Assignee: Persimmon Technologies, Corp., Wakefield, MA (US)

( * ) Notice: Subject to any disclaimer, the term of this patent is extended or adjusted under 35 U.S.C. 154(b) by 404 days.

(21) Appl. No.: 13/836,020

(22) Filed: Mar. 15, 2013

(51) Int. Cl.
  *G06F 7/00* (2006.01)
  *G06F 19/00* (2011.01)
  *H01L 21/677* (2006.01)

(52) U.S. Cl.
  CPC .............. *H01L 21/677* (2013.01); *Y10S 901/02* (2013.01)

(58) Field of Classification Search
  None
  See application file for complete search history.

(56) References Cited

U.S. PATENT DOCUMENTS

| | | | |
|---|---|---|---|
| 4,449,885 A | 5/1984 | Hertel et al. | |
| 4,507,078 A | 3/1985 | Tam et al. | |
| 4,523,985 A | 6/1985 | Dimock | |
| 4,770,590 A | 9/1988 | Hugues et al. | |
| 4,819,167 A | 4/1989 | Cheng et al. | |
| 4,955,780 A | 9/1990 | Shimane et al. | |
| 5,483,138 A | 1/1996 | Shmookler et al. | |
| 5,546,179 A | 8/1996 | Cheng | |
| 5,563,798 A | 10/1996 | Berken et al. | |
| 5,690,744 A | 11/1997 | Landau | |
| 5,704,062 A | 1/1998 | Caroleo | |
| 5,706,201 A | 1/1998 | Andrews | |
| 5,980,194 A | 11/1999 | Freerks et al. | |
| 6,198,976 B1 | 3/2001 | Sundar et al. | |
| 6,304,051 B1 * | 10/2001 | Sagues et al. | ............ 318/568.11 |
| 6,327,517 B1 | 12/2001 | Sundar | |
| 6,405,101 B1 | 6/2002 | Johanson et al. | |
| 6,502,054 B1 | 12/2002 | Mooring et al. | |
| 6,629,053 B1 * | 9/2003 | Mooring | ......................... 702/94 |
| 6,760,976 B1 | 7/2004 | Martinson et al. | |
| 7,008,802 B2 | 3/2006 | Lu | |
| 7,433,759 B2 | 10/2008 | Nangoy | |
| 7,792,350 B2 | 9/2010 | Kiley et al. | |
| 7,894,657 B2 | 2/2011 | van der Meulen et al. | |
| 7,933,665 B2 | 4/2011 | Sakiya et al. | |
| 7,963,736 B2 | 6/2011 | Takizawa et al. | |
| 8,224,607 B2 | 7/2012 | Sakhare et al. | |
| 2004/0167743 A1 | 8/2004 | Hosek | |

* cited by examiner

*Primary Examiner* — Yolanda Cumbess
(74) *Attorney, Agent, or Firm* — Harrington & Smith

(57) ABSTRACT

A method of determining a robot place location for a robot, the robot adapted to transport a substrate. The method comprises moving a calibration fixture past one or more edge sensors along a calibration path offset from and substantially parallel to a nominal transport path; determining robot locations when an edge of the calibration fixture changes a state of the one or more edge sensors; determining one or more sensor locations of the one or more edge sensors based on the robot locations; transporting the substrate along the nominal transport path past the one or more edge sensors to a target location; determining the robot place location based on the sensor locations; and placing the substrate at the target location with the robot located at the robot place location.

17 Claims, 8 Drawing Sheets

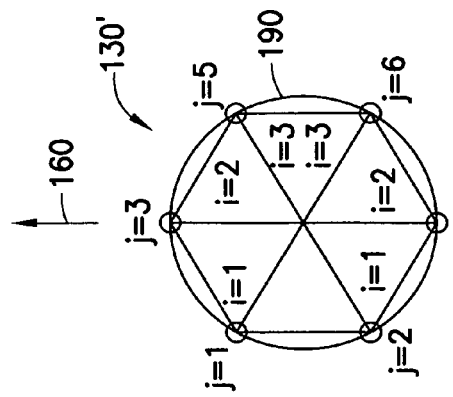
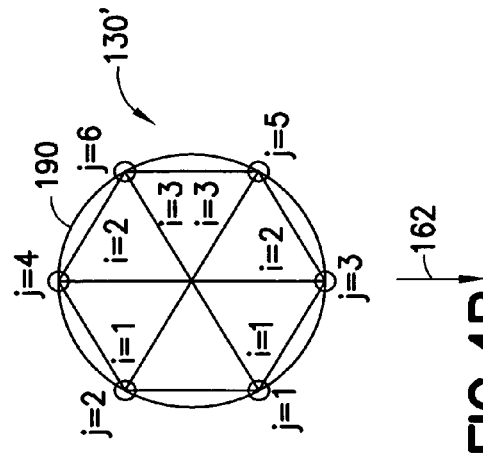
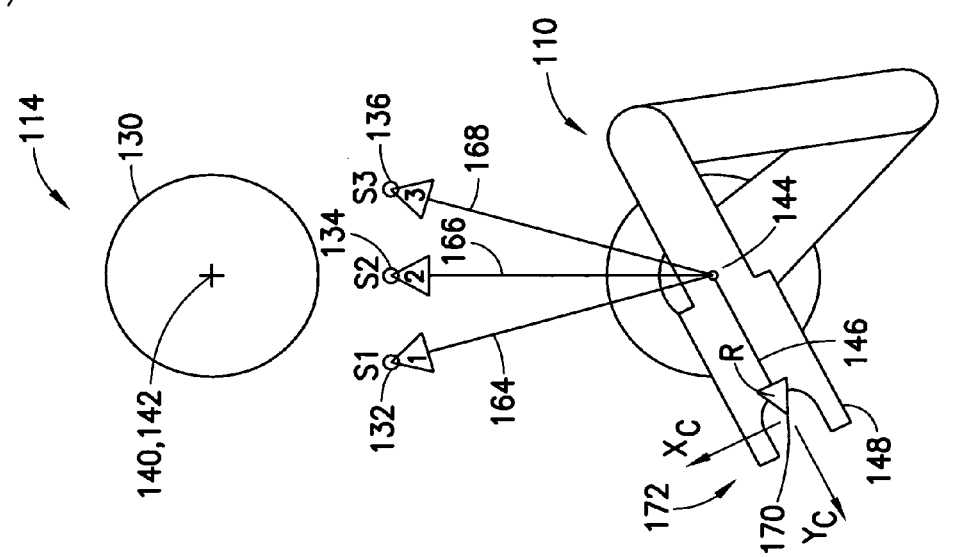

ADAPTIVE PLACEMENT SYSTEM AND METHOD

BACKGROUND

1. Technical Field

The exemplary and non-limiting embodiments relate generally to an adaptive placement system and method and more particularly to an adaptive substrate placement system and method.

2. Brief Description of Prior Developments

Substrate processing systems for semiconductor, LED or other suitable applications often require very accurate transfer and placement of substrates within the system to facilitate low process variability. Variables which affect the placement precision may include vibration, movement of the substrates on the transport system or within process modules of the processing system, thermal effects or otherwise. To overcome such variability, systems have added sensors and algorithms that attempt to detect and correct for such variables which affect the placement precision. In practice, the amount of error and variability is very sensitive to factors such as calibration accuracy, sensor variability or otherwise. Accordingly, there is a desire for a substrate placement system that is repeatable, precise and insensitive.

SUMMARY

The following summary is merely intended to be exemplary. The summary is not intended to limit the scope of the claims.

In accordance with one aspect, an example method comprises determining a robot place location for a robot, the robot adapted to transport a substrate. The method comprises moving a calibration fixture past one or more edge sensors along a calibration path offset from and substantially parallel to a nominal transport path; determining robot locations when an edge of the calibration fixture changes a state of the one or more edge sensors; determining one or more sensor locations of the one or more edge sensors based on the robot locations; transporting the substrate along the nominal transport path past the one or more edge sensors to a target location; determining the robot place location based on the sensor locations; and placing the substrate at the target location with the robot located at the robot place location.

In accordance with one aspect, an example method comprises determining robot placement for a robot, the robot adapted to transport a substrate. The method comprises transporting the substrate along a nominal transport path past two or more edge sensors to a target location; determining robot locations when an edge of the substrate changes a state of the two or more edge sensors; determining an initial robot place location offset distance from the nominal transport path based on nominal calibrated sensor locations and the robot locations; determining an actual robot place location based on offset calibrated sensor locations corresponding to the initial robot place location offset distance from the nominal transport path; and placing the substrate at the target location with the robot located at the actual robot location.

In accordance with another aspect, an example embodiment comprises an adaptive substrate placement system for placing a substrate at a target location. The placement system has a substrate transport robot; two ore more sensors configured to detect an edge of the substrate as the substrate transport robot moves the substrate along a nominal transport path to the target location; a controller configured to detect robot locations when the edge of the substrate changes a state of the two or more sensors; and the controller configured to determine a place location based on the robot locations and the target location. The substrata is placed at the target location with the robot located at the place location and wherein the place location is different than the target location.

BRIEF DESCRIPTION OF THE DRAWING

The foregoing aspects and other features are explained in the following description, taken in connection with the accompanying drawings, wherein:

FIG. 3 is a diagram illustrating an example apparatus;
FIG. 4A shows a substrate map;
FIG. 4B shows a substrate map.

DETAILED DESCRIPTION OF EMBODIMENTS

Figure 1:
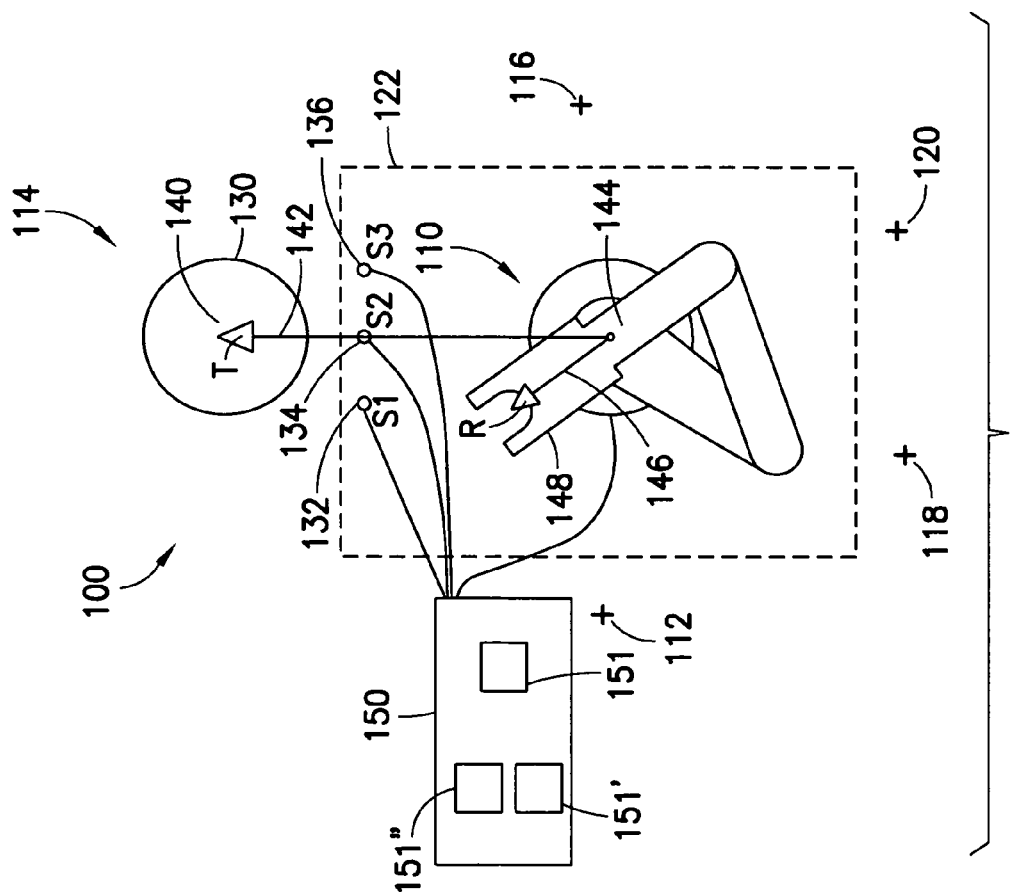
FIG. 1 is a diagram illustrating an example apparatus.

Referring to FIG. 1, there is shown a schematic top plan view of an example substrate processing apparatus 100 having a substrate transport apparatus or robot system 110. Although the present invention will be described with reference to the embodiments shown in the drawings, it should be understood that the present invention may be embodied in many forms of alternative embodiments. In addition, any suitable size, shape of type of materials or elements could be used.

Figure 2:
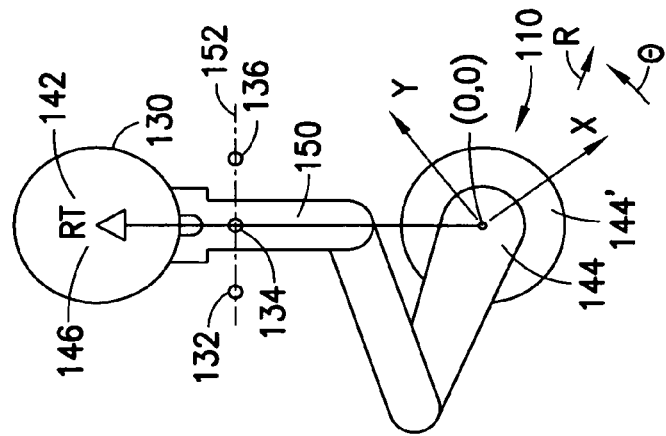
FIG. 2 is a diagram illustrating an example apparatus.

In addition to the substrate transport apparatus 110, in this example embodiment the substrate processing apparatus 100 may include multiple substrate processing chambers 112, 114, 116 and substrate load locks 118, 120 connected to a vacuum chamber 122. The transport apparatus 110 is located, at least partially, in the chamber 122 and is adapted to transport one or more planar substrate 130, such as semiconductor wafers or flat panel displays or other suitable substrates, between and/or among the chambers 112, 114, 116 and elevators or locks 118, 120. In alternate embodiments, the transport apparatus 110 could be used in any suitable type of substrate processing apparatus. Sensors 132, 134, 136 are shown connected to chamber 122 and are provided to detect an edge crossing of substrate 130 while being transported by robot 110. Here, sensors 132, 134, 136 may be optical through beam, reflective, inductive, capacitive or any suitable sensor or detector. Although three sensors are shown, more or less sensors may be provided. Although the sensors are shown in line and equidistant, any suitable sensor locations may be provided. Controller 150 may be connected to the transport apparatus 110 and sensors 132, 134, 136 and may control robot 110 and/or various devices. The controller 150 may comprise at least one processor 151, at least one memory 151', and software 151" for performing operations, including at least partially controlling movement of the robot, as described herein. Referring also to FIG. 2, there is also shown a top view of system 100. Station 114 may have a target location or station location 140 denoted by vector 142 that is designated "T" in the view shown. Vector 142 may be referenced from the robot origin 144 (for example, origin (0,0) of coordinate system 144' grounded to tool 100) and may be expressed in polar coordinates, cartesian coordinates or otherwise. Target location 140 may be for example, a destination location in station 114 for substrate 130. Similarly, robot 110 may have robot location vector 146, for example, located at a reference portion of end effector 148 that is designated "R" in the view shown. Vector 146 may be referenced from the robot origin 144 and move with the end effector 148 designating the location of the end effector 148 at any point in time as end effector 148 moves and may be expressed in polar coordinates, cartesian coordinates or otherwise. In one example, as seen in FIG. 2, when substrate 130 is properly located on end effector 148 and the robot 110 directs end effector 148 to target or station 114, the location of wafer 130 may be properly placed within station 114 where the robot location or position vector 146 may be the same as the station or target vector 142. In one aspect, a line along the station vector 142 or alternately the line between the robot origin 144 and the station location 140 may comprise a portion of a nominal transport path 150 that end effector 148 and thus the end of robot vector 146 travel along when nominally placing or picking a properly located wafer 130 in station 114 at the nominal station location 149, 142. In alternate aspects, the disclosed embodiment may be used with any suitable coordinate system or vectors with any suitable reference locations, for example, with respect to a different portion of end effector 148, station 114, system 100 or otherwise. In the embodiment shown, the nominal transport path may coincide in part with vector 142; alternately the nominal transport path may not or otherwise be located. Sensors 132, 134, 136 are shown nominally positioned along a sensor axis 152 substantially perpendicular to vector 142 and the transport path 150 with sensor 134 located in line with the transport path and sensors 132, 136 equidistant and offset from the nominal transport path 150. In alternate aspects, the sensors need not be equidistant or located on the transport path and need not be located along sensor axis 152.

Referring also to FIG. 3, the disclosed embodiment outlines the function and algorithms for the calibration and operation of an exemplary adaptive placement system (APS) system. The hardware of the APS system may consist of a triplet 132, 134, 136 of substantially equi-spaced through beam sensors placed between the robot 110 and substrate station 114 or target location 140, 142. The center sensor 134 may be nominally on a straight line connecting the center of the robot spindle 144 with the concerned station 114. During a substrate pick or place operation the moving substrate 130 linterrupts the continuity of the sensor 132, 134, 136 light beams. The location 146 of the end effector 148 at the instant of interruption is the input required by the APS algorithm. At the highest level, the APS performs in two modes. The first mode is calibration, wherein the APS executes test moves with the robot and uses feedback from the robot and sensors to determine the operational and tuning parameters for the APS setup. In the second mode, referred to as the operational mode, the APS adapts the end effector place location for optimal substrate placement at the target or station location 140, 142. These two modes are described in more detail below.

Figure 6:
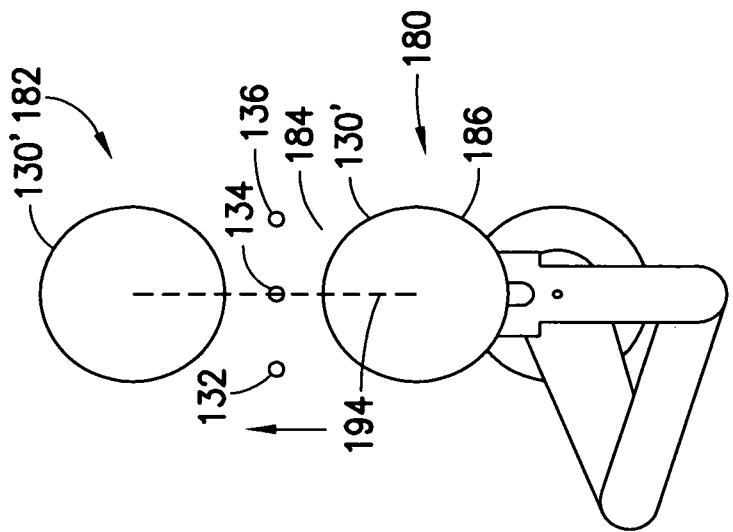
FIG. 6 is a diagram illustrating an example apparatus.
Figure 5:
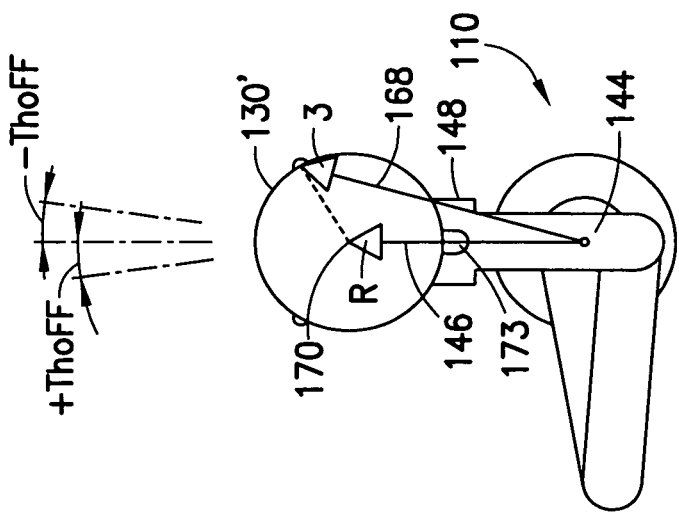
FIG. 5 is a diagram illustrating an example apparatus.

Referring to FIGS. 5 and 6, in the calibration mode, the spatial positioning of the sensors and their performance are measured. With respect to sensor positions, each substrate station may have three APS sensors associated with it. Alternately, more or less APS sensors may be provided at any suitable location. In order to maximize the accuracy of the APS algorithm the coordinates of these APS sensors may be known very precisely with respect to the robot coordinate system and as will be described, with respect to a substrate offset. To achieve this, the position information may be measured after the APS sensors have been mechanically fixture, for example, to chamber 122 or otherwise. The sensor positions are measured by moving a test substrate or fixture as part of or placed on the robot end effector through the sensor beams and capturing the substrate position at the instant a beam is interrupted. The corresponding sensor location is calculated from the captured substrate location as will be described in greater detail below.

During calibration, sensor locations, for example vectors 164, 166, 168 seen in FIG. 3 corresponding to sensor #1, 132, sensor #2, 134 and sensor #3, 136 are precisely determined. For calibration, a calibration fixture, for example, a circular test substrate 130' is placed on the robot end effector 148, for example, such that the center or reference location of the test substrate coincides with the end effector origin, for example at the end 170 of vector 146 typically referred as the center or origin (0,0) of the end effector and where end effector reference frame 172 may move with end effector 148 and robot location vector 146. Further, slot 173 may be provided in end effector 148 such that the trailing edge of test substrate 130' or substrate 130 may be detected. The calibration procedure may be repeated, in entirety, for all the stations equipped with APS sensors. All of the calibration procedures may be repeated as several times as required and the measurements may be averaged. By way of example, the number of times the measurement process is repeated for a station may be a configurable parameter.

As seen also with respect to FIG. 6, the first step in calibration is determining the approximate position 164, 166, 168 (see FIG. 3) of the APS sensors 132, 134, 136 by executing a move. This is achieved as follows:

1. Extend the robot 110 with the test substrate 130' on it from retracted position 180 to a position 182, for example, a nominal station position. Here, there will be six sensor events as the leading 184 and trailing 186 edge of substrate 130' cross the three APS sensors 132, 134, 136, for example, as seen in FIG. 4A.
2. At each sensor event the robot location 146, for example, the polar position (Rrbtj (m), Trbtj (rad)) of the end effector 148 is captured as well as the type of transition i.e. leading edge vs. trailing edge. It is noted that a leading edge is defined as a light to dark (l2d) transition for the sensor while a trailing edge is a dark to light (d2l) transition.
3. Retract the robot, for example, to R home 180 position or other suitable retract position.

The data captured above is the location of the end effector center 170, 146 when the test wafer 130' interrupts the three APS sensors 132, 134, 136 on the l2d and d2l transitions. The index j refer to quantities related to the six edge detection events and the index i refers to the sensors as summarized in the table below:

TABLE 1

Events associated with index j

| Index (j) | Sensor (i) | Event |
|---|---|---|
| 1 | Left 1 | Light to dark/Leading edge |
| 3 | Center 2 | Light to dark/Leading edge |
| 5 | Right 3 | Light to dark/Leading edge |

TABLE 1-continued

Events associated with index j

| Index (j) | Sensor (i) | Event |
|---|---|---|
| 2 | Left 1 | Dark to light/Trailing edge |
| 4 | Center 2 | Dark to light/Trailing edge |
| 6 | Right 3 | Dark to light/Trailing edge |

Here, as seen in FIGS. 4A and 4B, the six events correspond to locations where the edge 190 of test substrate 130' cross the sensors 132, 134, 136 for example, extending 160 (i.e. Table 1) such as FIG. 4A or retracting 162 such as FIG. 4B. The steps in the determination of the sensor locations 164, 166, 168 may be as follows. The procedure below may be performed multiple times utilizing variable offsets and offset or compound moves as will be described in greater detail below. Alternately, the procedure below may be performed once, for example, during an extend or retract move or twice or more at two or more theta offsets +ThOff and −ThOff as seen in FIG. 5 or otherwise. Alternately, any suitable combination or number of moves may be utilized and the results averaged or utilized as will be described. For example, the sensor location results from the one, two or more moves may be averaged. Here, the sensor locations may be determined as follows.

1. Move the robot to the T position corresponding to the station 114 location 140, 142 and theta offset (if any) in context and robot R to retracted position as seen in FIG. 6, 180 or home position 180.
2. Extend the arm.
3. Record the Polar position 146 of the end effector 148 at the single light to dark sensor events (center 2) as (Rrbt3, Trbt3).
4. Record the Polar positions 146 of the end effector 148 at the two light to dark sensor events (left 1, right 3) as (Rrbt1, Trbt1) and (Rrbt5, Trbt5), respectively.
5. Record the Polar positions 146 of the EE 148 at the two dark to light sensor events (left 1, right 3) as (Rrbt2, Trbt2) and (Rrbt6, Trbt6).
6. Record the Polar position 146 of the end effector 148 at the single dark to light sensor events (center 2) as, (Rrbt4, Trbt4).
7. Retract the robot to R home position 180.

In alternate aspects, the above procedure may be done with a retract move or other suitable move.

The positions 164, 166, 168 of left 1, 132, center 2, 134, and right 3, 136 sensors respectively in polar coordinates (Rsen1, Tsen1), (Rsen2, Tsen2), (Rsen3, Tsen3) respectively may be calculated as follows. The example below calculates the position 164 of the left side sensor 132 (Rsen1, Tsen1). Similarly, the center 2 and right 3 positions 166, 168 may be calculated. In the following equations Rwaf is the radius of the test fixture or substrate.

First the captured end effector positions 146 for i=1 and j=1 & 2 are converted to Cartesian coordinates Eq. 1:

$$x_1^{ee} = R_{rbt1} \times \cos(T_{rbt1})$$

$$y_1^{ee} = R_{rbt1} \times \sin(T_{rbt1})$$

$$x_2^{ee} = R_{rbt2} \times \cos(T_{rbt2})$$

$$y_2^{ee} = R_{rbt2} \times \sin(T_{rbt2}) \quad \text{(Eq. 1)}$$

Following intermediate variables are calculated Eq. 2:

$$dx = (x_2^{ee} - x_1^{ee})/2$$

$$dy = (y_2^{ee} - y_1^{ee})/2$$

$$z = \sqrt{dx^2 + dy^2}$$

$$v = \sqrt{Rwaf^2 - z^2} \quad \text{(Eq. 2)}$$

The position of the sensor is calculated in Cartesian coordinates as Eq. 3:

$$x_1^{sen} = x_1^{ee} + dx - dy\frac{v}{z} \quad \text{(Eq. 3)}$$

$$y_1^{sen} = y_1^{ee} + dy + dx\frac{v}{z}$$

Finally the position 164 of the sensor 132 is converted to Polar coordinates as Eq. 4:

$$R_{sen1} = \sqrt{x_1^{sen2} + y_1^{sen2}}$$

$$T_{sen1} = a\tan 2(y_1^{sen}, x_1^{sen}) \quad \text{(Eq. 4)}$$

Figure 8:
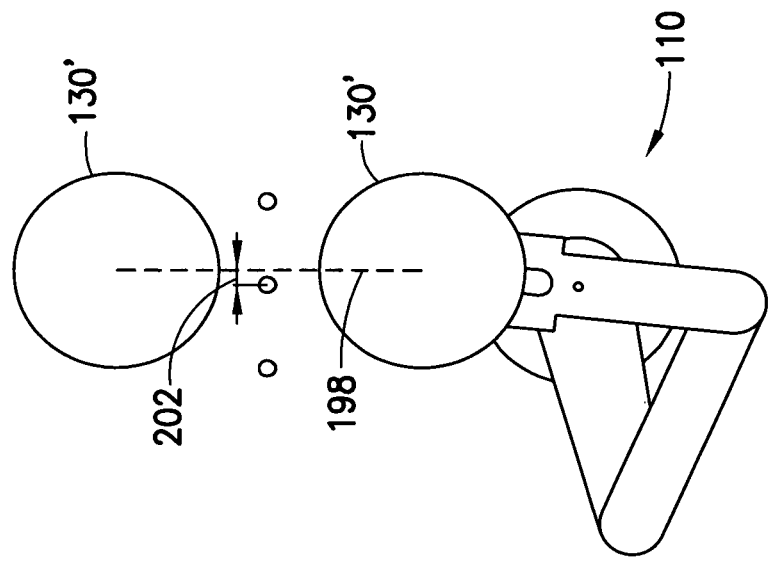
FIG. 8 is a diagram illustrating an example apparatus.
Figure 7:
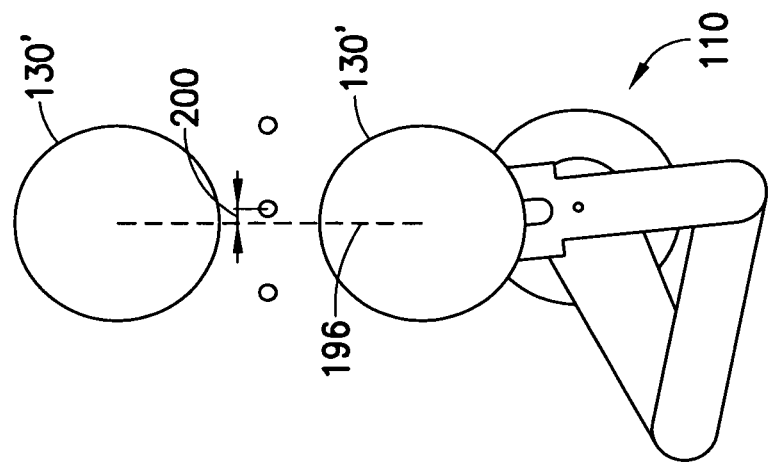
FIG. 7 is a diagram illustrating an example apparatus.

Similarly, the center 2 and right 3 positions 166, 168 may be calculated. The procedure above may be repeated for the same move and the results for each sensor averaged. Alternately, the procedure above may be repeated for different moves and the results of each sensor averaged. The different moves may be offset from each other by one or more angles where the robot executes a radial move offset by the angle(s) and the results averaged. Alternately and in addition to the above, as seen in FIGS. 7 & 8, the different moves 196, 198 may be offset from each other by one or more offset values 200, 202 where the robot executes a compound move, for example, offset from and parallel to a nominal radial move 194 as seen in FIG. 6 and offset by the offset value(s) and the results averaged. Alternately, the different moves may be offset from each other by one or offset values where the robot executes a compound move, for example, offset from a nominal radial move 194 and offset by the offset value(s) and the results provided in a look up table and/or be curve fit to refine the robot place location for further precision as will be described with respect to FIGS. 9 and 10.

Figure 10:
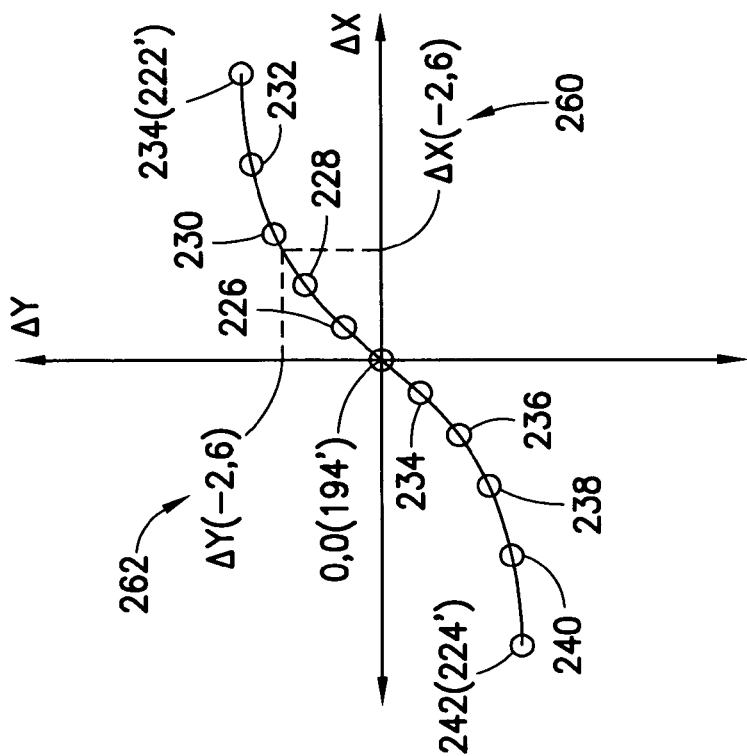
FIG. 10 is a graph.
Figure 9:
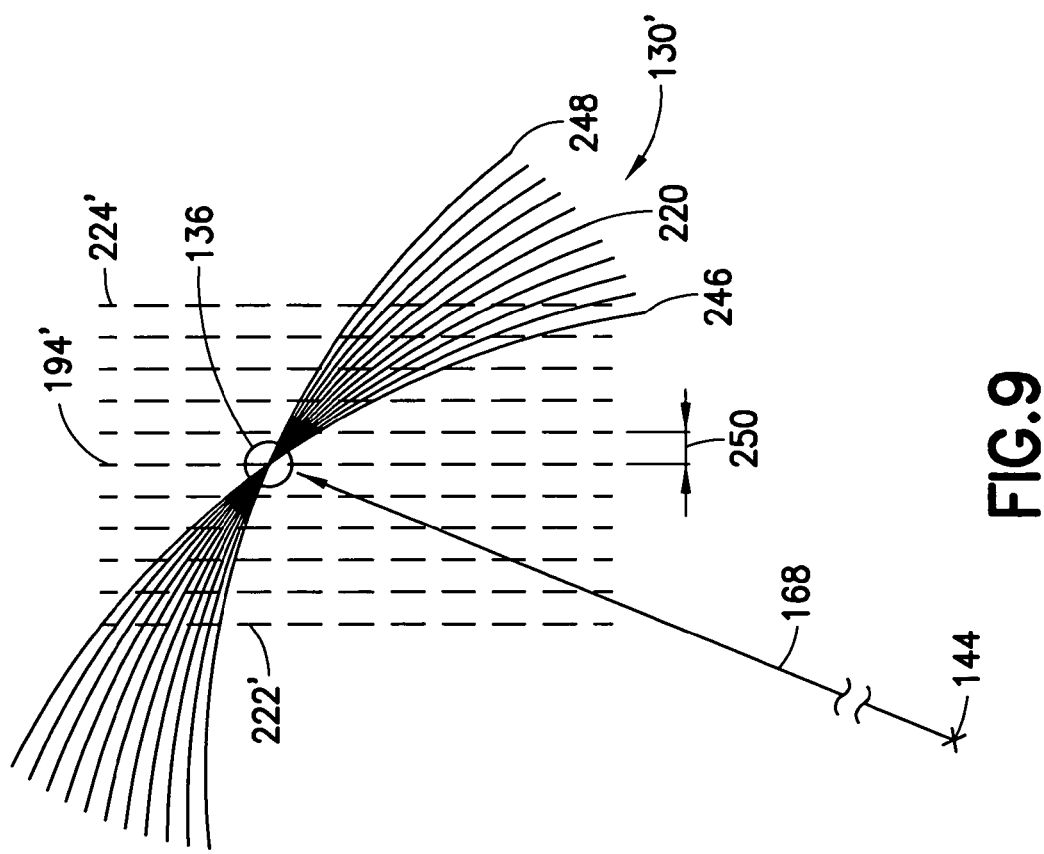
FIG. 9 is a diagram of a detector.

Referring also to FIGS. 9 and 10, the APS algorithm may utilize multiple calibrated sensor locations for a given sensor to calculate the adjusted placement location with the sensor locations being identified for different motion paths in the initial calibration process. By way of example, sensor 136 is shown in FIG. 9 where multiple passes of test wafer 130' with the robot moving at multiple paths offset and parallel to a nominal transport path are taken. Similarly, the process may be accomplished in parallel or otherwise with respect to sensors 132, 134. This improves the accuracy of the APS because it takes into account inconsistencies associated with the change in the wafer edge angle as it enters a sensor when the wafer is misaligned on the robot end-effector. This scenario is emulated by the different motion paths in the initial calibration process as will be described with respect to FIGS. 9 and 10. In the calibration process, substrate 130' is moved along a nominal transport path 194. In FIG. 9, 194' refers to the nominal track of a point on the edge 220 of substrate that crosses sensor 136 when the robot is moving substrate 130' along a nominal path 194. In FIG. 10, the origin refers to a reference to the nominal calibrated location 168 of sensor where the x and y axis refers to an offset from the calibrated location 168. In the calibration process, the robot performs multiple moves 194' . . . 222' . . . 224' to find multiple calibrated sensor locations for a given sensor 136. These moves include the nominal motion 194' path as well as additional calibration motion paths on each side of the nominal motion path, for example, from path 194' to 222' on the left and 194' to 224' on the right offset and parallel to path 194'. The differences between these offset calibration locations and the nominal calibration locations are stored as shown in FIG. 10. Here, point 0,0 corresponds to the calibration location 168 for path 194'. Points 226, 228, 230, 232, 234 correspond to the difference between the offset calibration locations for paths 194'-222' and the nominal calibration location 168, for example, where point 234 corresponds to the offset calibration location for path 222'. Similarly, points 234, 236, 238, 240, 242 correspond to the difference between the offset calibration locations for paths 194'-224' and the nominal calibration location 168, for example, where point 242 corresponds to the offset calibration location for path 224'. Here, the additional calibration paths being, for example, substantially parallel to the nominal motion path. Typically, the additional calibration motion paths are defined so that the wafer follows a similar path that it would follow if it were misalignment on the robot end-effector up to the point of the maximum expected misalignment of the wafer on the robot end-effector. For example, the wafer edge profile 246 corresponds to where the wafer is offset to the left along 222' and where the wafer edge profile 248 corresponds to where the wafer is offset to the right along 224'. Here, the differing wafer edge profile affects the calibrated sensor locations. As an example, assuming that the maximum expected misalignment of the wafer on the robot end-effector is 5 mm, five additional calibration motion paths 194'-222' and 194'-224' as shown on each side of the nominal motion path may be used, the five additional calibration motion paths being equally spaced with an increment 250 of 1 mm. Alternatively, any suitable shape and spacing and increment spacing of the calibration motion paths may be used. Referring to FIG. 10, when the robot performs an APS place operation, the adjusted placement location is first calculated using the sensor locations 168 identified based on the nominal calibration motion path 194. The resulting preliminary lateral difference or offset is then estimated and used to determine the calibration motion path that is closest to the actual path of the wafer. For example, the resulting preliminary lateral difference may be estimated as Retarget*(Ttarget−Tplace) with Ttarget being the target angular location in radians, Tplace being the adjusted placement angular location in radians and R target being the radial location of the target in meters. Here, an initial robot place location offset distance from the nominal transport path based on nominal calibrated sensor locations and the robot locations is determined Eq. 5:

$$\text{InitOffset} = R_{Target} * (T_{Target} - T_{InitPlace}^{ee}) \tag{Eq. 5}$$

The resultant preliminary offset InitOffset may be converted to mm or other suitable units. Here, the adjusted placement location may then be recalculated using the calibrated sensor locations identified based on this calibration motion path. For example, if offset calibration location data point 228 corresponds to an offset of −2 mm and offset calibration location data point 230 corresponds to an offset of −3 mm and if the resulting preliminary lateral difference calculated is −2.6 mm then an offset calibrated sensor location may be calculated by offsetting nominal calibration location 168 by x offset 260 and y offset 262 extrapolated as shown in FIG. 10 resulting in the offset calibrated sensor location for a −2.6 mm offset. Alternately, the closer calibration location data point may be used instead of extrapolation. Alternatively, the adjusted placement location may be recalculated as an average of results determined using the sensor locations identified based on the two closest calibration motion paths, each on one side of the actual path of the wafer. The average may be weighted to reflect the distance of the actual path of the wafer from the two closest calibration motion paths. Alternatively, any suitable algorithm may be employed to recalculate the adjusted placement location using the sensor locations identified based on the additional calibration motion paths.

Figure 12:
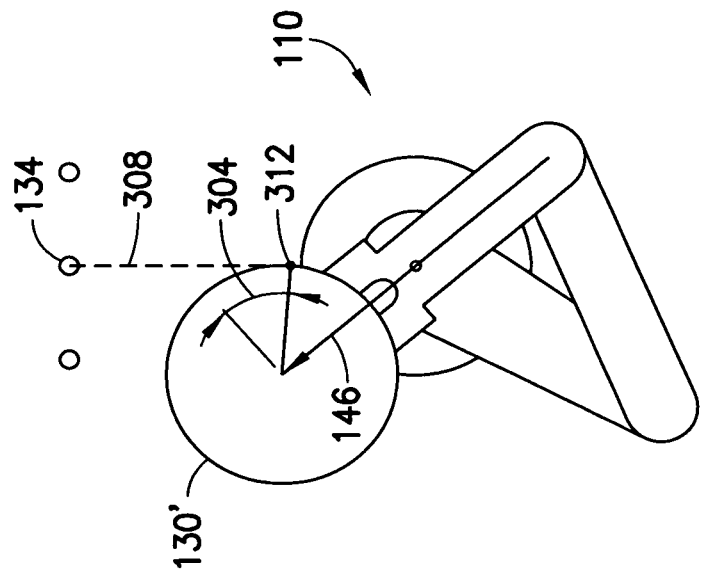
FIG. 12 is a diagram illustrating an example apparatus.
Figure 11:
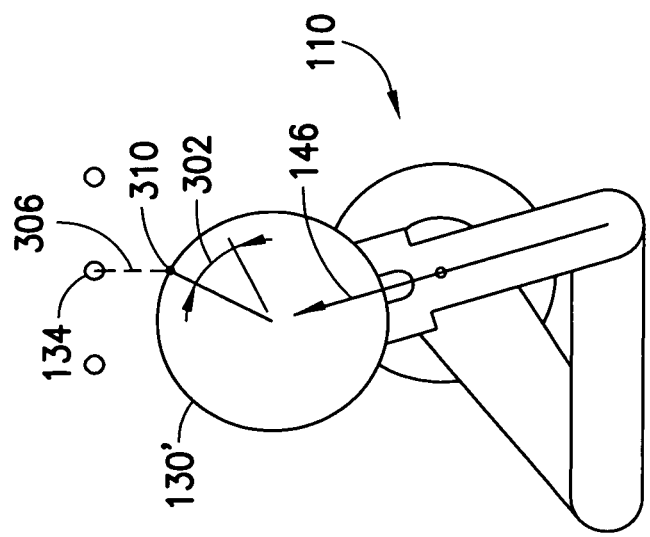
FIG. 11 is a diagram illustrating an example apparatus.

Referring now to FIGS. 11 and 12, there is shown a view of system 100. Another aspect of the disclosed embodiment is where calibration of a given sensor may be done at an optimized or selectable location on the edge of test substrate 130'. By way of example, when robot runs calibration along path 150 or 198, the center sensor 134 coincides with the leading edge of substrate 130'. This position yields a very accurate radial location of sensor 134 but a noisy angular location of sensor 134 due to the angles involved in the calculation. As an alternative, a point, for example point 310 associated with the leading edge and point 312 associated with the trailing edge of substrate 130' may be used to track along radial trajectory 306, 308 respectively with a compound move during calibration such that the edge crosses sensor 134 at selectable angles 302, 304 with the robot location 146 tracking offset from paths 306, 308 for more accurate calibration of center sensor 134.

Figure 13:
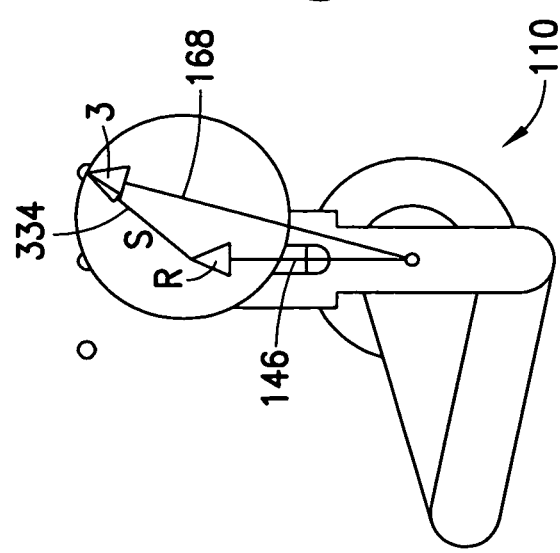
FIG. 13 is a diagram illustrating an example apparatus.

Referring to FIG. 13, placement location determination is shown. During a pick or place or other suitable operation, a vector 146 representing the polar position (Rrbtj, Trbtj); j=1-6 of the end effector may be collected at each sensor event. The measurements may be used to directly calculate an end effector place location 332 to achieve optimum station or target placement as will be described Eq. 6:

$$\vec{r}_{rbtj} = [R_{rbtj}, T_{rbtj}] \tag{Eq. 6}$$

As described, a vector 142 to the station or target location in a main coordinate system is defined Eq. 7:

$$\vec{r}_{tgt} = [R_{tgt}, T_{tgt}] \tag{Eq. 7}$$

As described, vector 164, 166, 168 to location of sensor i, i=1, 2, 3, in main coordinate system is defined Eq. 8:

$$\vec{r}_{seni} = [R_{seni}, T_{seni}], i=1,2,3 \tag{Eq. 8}$$

Next, vectors 334 rsns representing the location vector to each point j on the wafer edge which was detected by sensor i in the coordinate system attached to the robot end effector are calculated from the end effector positions (Rrbtj, Trbtj) corresponding to the six sensor events for j=1, 2, . . . , 6; i=1 for j=1, 2; i=2 for j=3, 4; i=3 for j=5, 6 Eq. 9:

$$[R_j^{sns}, T_j^{sns}] = \vec{r}_j^{sns} = \vec{r}_{seni} - \vec{r}_{rbtj} \tag{Eq. 9}$$

Next, define a hypothetical vector 336 rjtgt to each of above defined points j from the target location using the coordinate system associated with the target location Eq. 10:

$$[R_j^{tgt}, T_j^{tgt}] = \vec{r}_j^{tgt} = \vec{r}_j^{rbt} + \vec{r}_{place} - \vec{r}_{tgt}, i=1, 2, \ldots, 6 \tag{Eq. 10}$$

Here, rplace is an unknown vector 332' to placement location (end point of robot extension move) adjusted to achieve target wafer location, expressed in main coordinate system Eq. 11:

$$\vec{r}_{place} = [R_{place}, T_{place}] \tag{Eq. 11}$$

Next, minimize the distance of the above defined points j from the circumference of a fictitious circle located at the target location, using the following minimization function with the unknown place location vector 332' rplace and associated components as the sole variable Eq. 11:

$$FN = \sum_{j=1}^{6} \left(|\vec{r}_j^{tgt}| - R_{waf}\right)^2 = \sum_{j=1}^{6} \left(|\vec{r}_j^{sns} + \vec{r}_{place} - \vec{r}_{tgt}| - R_{waf}\right)^2$$

Next, solve or use a numerical iterative technique to minimize above cost function by iterating through rplace 332', for example starting with the previously calculated rplace for the target or station location or target location or start from an arbitrary value, for example, rtgt 142.

Stop numerical iterations when change of rplace, reaches specified accuracy, i.e., the following condition is satisfied Eq. 12:

$$|\vec{r}_{place}^{k} - \vec{r}_{place}^{k-1}| < e \qquad \text{(Eq. 12)}$$

Where k is iteration step number, and e is specified accuracy.

Figure 15:
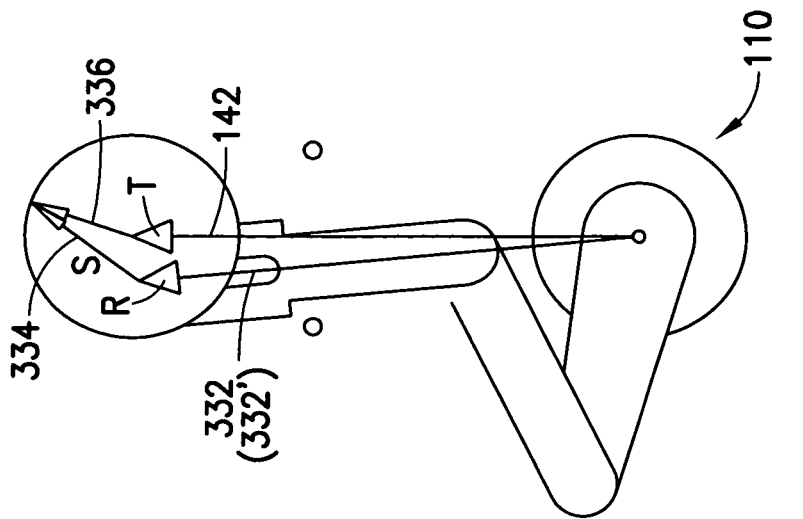
FIG. 15 is a diagram illustrating an example apparatus.
Figure 14:
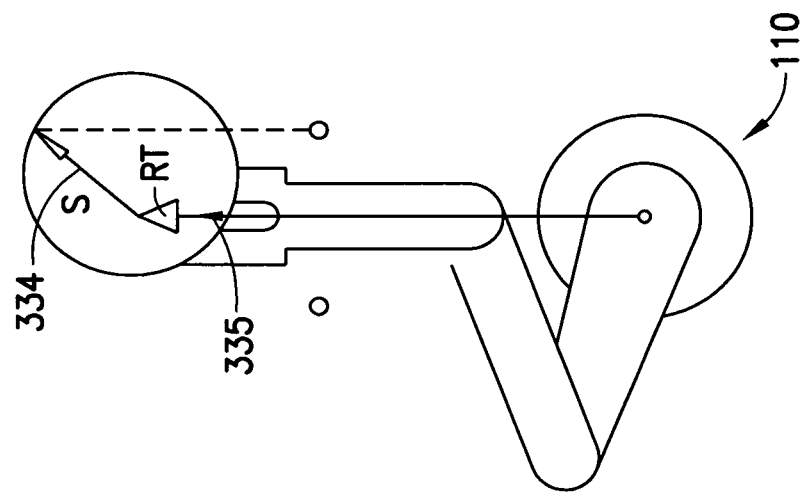
FIG. 14 is a diagram illustrating an example apparatus.

Here, a final vector to placement location rplace final 332; i.e. the end point of robot extension move is adjusted to achieve target wafer location and is provided as a solution of the above minimization process Eq. 13.

$$FN(\vec{r}_{place}^{final}) = \min FN(\vec{r}_{place}) \qquad \text{(Eq. 13)}$$

Where the coordinate of placement location; i.e. the end point of robot extension move may be adjusted to achieve target wafer location are directly obtained with the above vector. The robot may track the nominal transport path to the target location 140, 142, for example, as seen in FIG. 14. Here, the tip of vector 334 will be in line with its respective sensor as shown. The robot may then be directed to the place location 332 as seen in FIG. 15. Alternately, the robot may track the nominal transport path to an intermediate location 335, for example, as seen in FIG. 14. The robot may then alternately be directed to the place location 332 as seen FIG. 15.

In the disclosed embodiment, an adaptive substrate placement system for placing a substrate at a target location is disclosed. The placement system has a substrate transport robot 110 and two or more sensors 132, 134, 136 configured to detect an edge of the substrate 130 as the substrate transport robot 110 moves the substrate along a nominal transport path 150 to the target location. Controller 150 is provided configured to detect robot locations 170, 146 when the edge of the substrate 130 changes a state of the two or more sensors. Controller 150 is also configured to determine a place location 332 based on the robot locations and the target location 142. Here, the substrate 130 is placed at the target location 140, 142 with the robot located at the place location 332 and wherein the place location 332 is different than the target location 142. Controller 150 may be further configured to determine an initial robot place location offset distance (Eq. 5) from the nominal transport path 194 based on nominal calibrated sensor locations 164, 166, 168 and the robot locations 146. Controller 150 may be further configured to determine the robot place location 332 based on offset calibrated sensor locations (FIG. 10) corresponding to the initial robot place location offset distance from the nominal transport path 194. Calibration fixture 130' may also be provided with controller 150 configured to move the calibration fixture past the two or more edge sensors along a calibration path 200, 202 offset from and substantially parallel to the nominal transport path 194. Here, Controller 150 may be configured to determine robot calibration locations (FIG. 9, 10) when an edge of the calibration fixture changes a state of the two or more edge sensors. Here, controller 150 may be configured to determine sensor locations of the two or more edge sensors based on the robot calibration locations. In one aspect, the two or more edge sensors comprise three edge sensors aligned in a sensor row nominally perpendicular to the nominal transport path (FIG. 2). Here, controller 150 may be configured to move calibration fixture 130' along the nominal transport path 194 and when moving the calibration fixture along the nominal transport path the edge sensors intersect an edge of the calibration fixture at six points forming a hexagon with substantially equal sides (FIG. 4A, 4B). Controller 150 may further be configured to determine the offset calibrated sensor locations of the two or more edge sensors based on averaging robot calibration locations from more than one calibration paths offset from and substantially parallel to the nominal transport path. Here, multiple offset calibration sensor locations may be determined for each sensor based on corresponding multiple calibration paths having multiple offsets from and substantially parallel to the nominal transport path (FIGS. 9 and 10). Controller 150 may be configured to determine the robot place location 332 by defining a minimization function with a robot place location variable 332' defined as a variable within the minimization function (Eq. 11). Here, controller 150 may be configured to numerically iterate the minimization function by varying the robot place location variable 332' to determine the robot place location 332. Here, within the minimization function, the solution to which comprises the robot place location 332.

Figure 16:
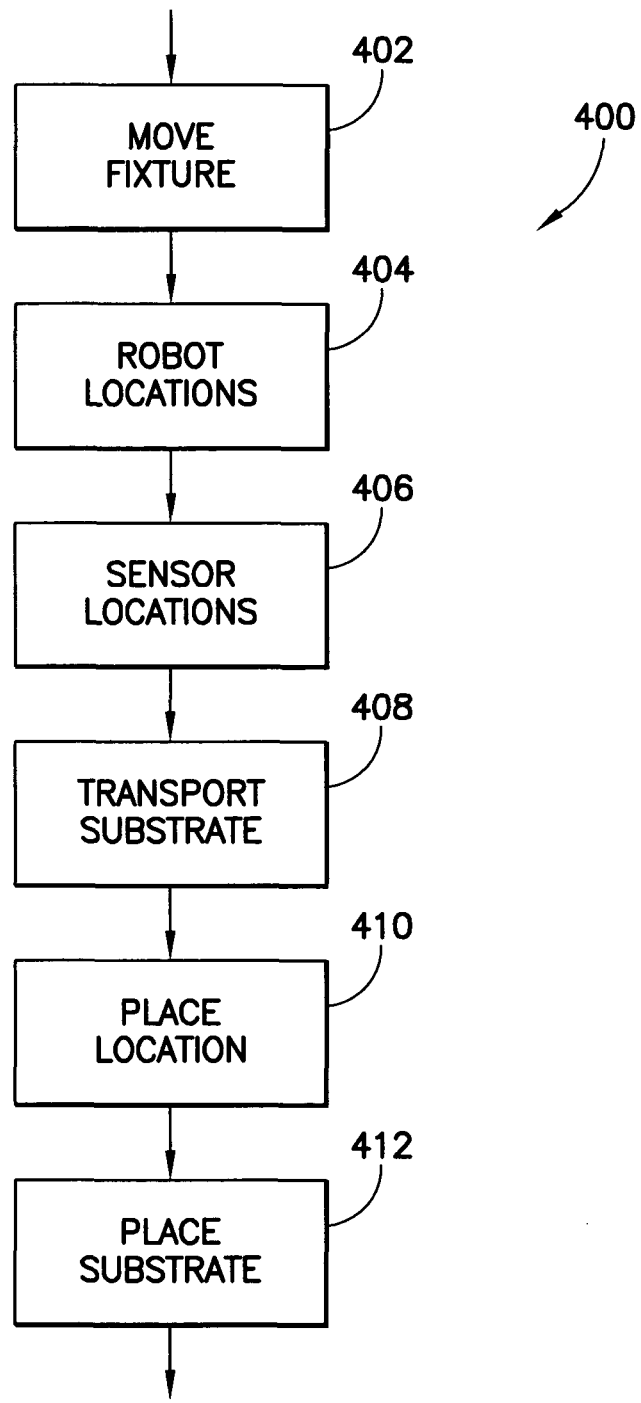
FIG. 16 is a flow chart.

Referring Now to FIG. 16, there is shown an exemplary method 400 as will be described. When the robot 100 performs an APS place operation, the adjusted placement location may be first calculated using the sensor locations 164, 166, 168 identified based on the nominal calibration motion path 194. The resulting lateral difference (Eq. 5) is then used to determine the calibration motion path that is closest to the actual path of the wafer, and the adjusted placement location is recalculated using the sensor locations identified based on this calibration motion path. Alternatively, the adjusted placement location may be recalculated as an average of results determined using the sensor locations identified based on the two closest calibration motion paths, each on one side of the actual path of the wafer (FIGS. 9 and 10). The average may be weighted to reflect the distance of the actual path of the wafer from the two closest calibration motion paths. Alternatively, any suitable algorithm may be employed to recalculate the adjusted placement location using the sensor locations identified based on the additional calibration motion paths. In FIG. 16, there is shown exemplary method 400 for determining a robot place location 332 for a robot 110, the robot adapted to transport a substrate. The method comprises 402 moving a calibration fixture 130' past one or more edge sensors 132, 134, 136 along a calibration path 200, 202 offset from and substantially parallel to a nominal transport path 194, 150. The method further comprises 404 determining robot locations 146 when an edge of the calibration fixture 130' changes a state of the one or more edge sensors. The method further comprises 406 determining one or more sensor locations of the one or more edge sensors based on the robot locations. The method further comprises 408 transporting the substrate 130 along the nominal transport path 150 past the one or more edge sensors to a target location 140, 142. The method further comprises 410 determining the robot place location 332 based on the sensor locations. The method further comprises 412 placing the substrate at the target location 140, 142 with the robot located at the robot place location 332. Here, the one or more edge sensors may be three edge sensors 132, 134, 136 and wherein when moving the calibration fixture 130' along the nominal transport path the edge sensors intersect the edge of the calibration fixture at six points forming a hexagon with substantially equal sides (FIGS. 4a, 4B). Here, determining sensor locations of the one or more edge sensors based on the robot locations may comprise averaging robot locations from more than one calibration path offset from and substantially parallel to the nominal transport path. Multiple sensor locations may be determined for each sensor based on corresponding multiple calibration paths having multiple offsets from and substantially parallel to the nominal transport path (FIGS. 9 and 10). Determining the robot place location based on the sensor locations may comprise defining a minimization function (Eq. 11) with the robot place location defined as an unknown variable 332' within the minimization function and numerically iterating the minimization function by varying the robot place location 332' to determine a final robot place location 332. Moving the calibration fixture past one or more edge sensors along the calibration path offset from and substantially parallel to the nominal transport path may comprise moving the robot with a compound move (FIG. 7, 8). Here, method 400 discloses a method for determining robot placement for a robot. Here, the substrate may be transported along a nominal transport path 150 past two or more edge sensors to a target location 140, 142 where the robot locations are determined when an edge of the substrate changes a state of the two or more edge sensors. Determining a place location may include determining an initial robot place location offset distance from the nominal transport path (Eq. 5) based on nominal calibrated sensor locations 164, 166, 168 and the robot locations; then determining an actual robot place location 332 based on offset calibrated sensor locations corresponding to the initial robot place location offset distance from the nominal transport path (FIG. 10); and placing the substrate at the target location 142 with the robot located at the actual robot place location 332. Here, the two or more edge sensors may comprise three edge sensors aligned in a sensor row substantially perpendicular to the nominal transport path. The method may further comprise determining the offset calibrated sensor locations of the two or more edge sensors based on averaging robot calibration locations from more than one calibration path offset from and substantially parallel to the nominal transport path. Here, multiple offset calibration sensor locations may be determined for each sensor based on corresponding multiple calibration paths having multiple offsets from and substantially parallel to the nominal transport path (FIG. 9). Determining the actual robot place location may comprise defining a minimization function (Eq. 11) with the actual robot place location defined as a variable 332' within the minimization function and numerically iterating the minimization function by varying the actual robot place location to determine a final robot place location 332.

An example method may comprise a method for determining a robot place location for a robot, the robot adapted to transport a substrate, the method comprising moving a calibration fixture past one or more edge sensors along a calibration path offset from and substantially parallel to a nominal transport path; determining robot locations when an edge of the calibration fixture changes a state of the one or more edge sensors; determining one or more sensor locations of the one or more edge sensors based on the robot locations; transporting the substrate along the nominal transport path past the one or more edge sensors to a target location; determining the robot place location based on the sensor locations; and placing the substrate at the target location with the robot located at the robot place location.

An example method may comprise a method for determining robot placement for a robot, the robot adapted to transport a substrate, the method comprising transporting the substrate along a nominal transport path past two or more edge sensors to a target location; determining robot locations when an edge of the substrate changes a state of the two or more edge sensors; determining an initial robot place location offset distance from the nominal transport path based on nominal calibrated sensor locations and the robot locations; determining an actual robot place location based on offset calibrated sensor locations corresponding to the initial robot place location offset distance from the nominal transport path; and placing the substrate at the target location with the robot located at the actual robot place location.

An example apparatus may be provided with an adaptive substrate placement system for placing a substrate at a target location, the placement system comprising a substrate transport robot; two or more sensors configured to detect an edge of the substrate as the substrate transport robot moves the substrate along a nominal transport path to the target location; a controller configured to detect robot locations when the edge of the substrate changes a state of the two or more sensors; and the controller configured to determine a place location based on the robot locations and the target location; wherein, the substrate is placed at the target location with the robot located at the place location and wherein the place location is different than the target location.

One type of example method may comprise a method for determining a robot place location for a robot, the robot adapted to transport a substrate, the method comprising moving a calibration fixture past one or more edge sensors along a calibration path, where the calibration path is offset from and substantially parallel to a nominal transport path; determining at least one robot location when an edge of the calibration fixture is sensed by at least one of the one or more edge sensors; determining at least one sensor location of the one or more edge sensors based on the at least one robot location; transporting the substrate along the nominal transport path past the one or more edge sensors to a target location; determining the robot place location based on the at least one sensor location; and placing the substrate at the target location with the robot located at the robot place location.

The one or more edge sensors may comprise three edge sensors and wherein when moving the calibration fixture along the nominal transport path the edge sensors intersect the edge of the calibration fixture at six points forming a hexagon with substantially equal sides. Determining at least one sensor location of the one or more edge sensors based on the robot locations may comprise averaging robot locations from more than one calibration path offset from and substantially parallel to the nominal transport path. Multiple sensor locations may be determined for each sensor based on corresponding multiple calibration paths having multiple offsets from and substantially parallel to the nominal transport path. Determining the robot place location based on the sensor locations may comprise defining a minimization function with the robot place location defined as an unknown variable within the minimization function and numerically iterating the minimization function by varying the robot place location to determine a final robot place location. Moving the calibration fixture past one or more edge sensors along the calibration path offset from and substantially parallel to the nominal transport path may comprise moving the robot with a compound move.

One type of example method may comprise a method for determining robot placement for a robot, the robot adapted to transport a substrate, the method comprising transporting the substrate along a nominal transport path past two or more edge sensors to a target location; determining robot locations when an edge of the substrate changes is sensed by the two or more edge sensors; determining an initial robot place location offset distance from the nominal transport path based on nominal calibrated sensor locations and the robot locations; determining an actual robot place location based on offset calibrated sensor locations corresponding to the initial robot place location offset distance from the nominal transport path; and placing the substrate at the target location with the robot located at the actual robot place location.

The method may further comprise moving a calibration fixture along the nominal transport path, wherein the two or more edge sensors comprise three edge sensors aligned in a sensor row substantially perpendicular to the nominal transport path and wherein when moving the calibration fixture along the nominal transport path the edge sensors intersect an edge of the calibration fixture at six points forming a hexagon with substantially equal sides. The method may further comprise determining the offset calibrated sensor locations of the two or more edge sensors based on averaging robot calibration locations from more than one calibration path offset from and substantially parallel to the nominal transport path. Multiple offset calibration sensor locations may be determined for each sensor based on corresponding multiple calibration paths having multiple offsets from and substantially parallel to the nominal transport path. Determining the actual robot place location may comprise defining a minimization function with the actual robot place location defined as a variable within the minimization function and numerically iterating the minimization function by varying the actual robot place location to determine a final robot place location. The method may further comprise moving A calibration fixture past the two or more edge sensors along a calibration path offset from and substantially parallel to the nominal transport path by moving the robot with a compound move.

An example embodiment may be provided with adaptive substrate placement system for placing a substrate at a target location, the placement system comprising a substrate transport robot; two or more sensors configured to detect an edge of the substrate as the substrate transport robot moves the substrate along a nominal transport path to the target location; and a controller configured to detect robot locations when the edge of the substrate is sensed by the two or more sensors, wherein the controller is configured to determine a place location based on the robot locations and the target location, wherein the adaptive substrate placement system is configured to place the substrate at the target location with the robot located at the place location, and wherein the place location is different than the target location.

The controller may be further configured to determine an initial robot place location offset distance from the nominal transport path based on nominal calibrated sensor locations and the robot locations and wherein the controller is further configured to determine the robot place location based on offset calibrated sensor locations corresponding to the initial robot place location offset distance from the nominal transport path. The apparatus may further comprise a calibration fixture, wherein the controller is configured to move the calibration fixture past the two or more edge sensors along a calibration path offset from and substantially parallel to the nominal transport path, wherein the controller is configured to determine robot calibration locations when an edge of the calibration fixture changes a state of the two or more edge sensors and wherein the controller is configured to determine sensor locations of the two or more edge sensors based on the robot calibration locations. The two or more edge sensors may comprise three edge sensors aligned in a sensor row nominally perpendicular to the nominal transport path and wherein the controller is configured to move a calibration fixture along the nominal transport path and wherein when moving the calibration fixture along the nominal transport path the edge sensors intersect an edge of the calibration fixture at six points forming a hexagon with substantially equal sides. The controller may be further configured to determine the offset calibrated sensor locations of the two or more edge sensors based on averaging robot calibration locations from more than one calibration paths offset from and substantially parallel to the nominal transport path. Multiple offset calibration sensor locations may be determined for each sensor based on corresponding multiple calibration path having multiple offsets from and substantially parallel to the nominal transport path. The controller may be configured to determine the robot place location by defining a minimization function with a robot place location variable defined as a variable within the minimization function and wherein the controller is configured to numerically iterate the minimization function by varying the robot place location variable to determine the robot place location. The controller may be configured to determine the robot place location by defining a minimization function with a robot place location variable defined as a variable within the minimization function, the solution to which comprises the robot place location.

In accordance with one example, a non-transitory program storage device readable by a machine, tangibly embodying a program of instructions executable by the machine for performing operations may be provided, such as the memory 151' for example, where the operations comprise any of the operations performed by the controller as described herein. The methods described above may be at least partially performed or controlled with the processor 151, memory 151' and software 151".

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A method for determining a robot place location for a robot, the robot adapted to transport a substrate, the method comprising:
   moving a calibration fixture past one or more edge sensors along a calibration path, where the calibration path is offset from and substantially parallel to a nominal transport path;
   determining at least one robot location when an edge of the calibration fixture is sensed by at least one of the one or more edge sensors;
   determining at least one sensor location of the one or more edge sensors based on the at least one robot location;
   transporting the substrate along the nominal transport path past the one or more edge sensors to a target location;
   determining the robot place location based on the at least one sensor location; and
   placing the substrate at the target location with the robot located at the robot place location,
   wherein moving the calibration fixture, past one or more edge sensors along the calibration path offset from and substantially parallel to the nominal transport path, comprises moving the robot with a compound move.

2. The method of claim 1, wherein the one or more edge sensors comprise three edge sensors and wherein when moving the calibration fixture along the nominal transport path the edge sensors intersect the edge of the calibration fixture at six points forming a hexagon with substantially equal sides.

3. The method of claim 1, wherein determining at least one sensor location of the one or more edge sensors based on the robot locations comprises averaging robot locations from more than one calibration path offset from and substantially parallel to the nominal transport path.

4. The method of claim 1, wherein multiple sensor locations are determined for each sensor based on corresponding multiple calibration paths having multiple offsets from and substantially parallel to the nominal transport path.

5. The method of claim 1, wherein determining the robot place location based on the sensor locations comprises defining a minimization function with the robot place location defined as an unknown variable within the minimization function and numerically iterating the minimization function by varying the robot place location to determine a final robot place location.

6. A method for determining robot placement for a robot, the robot adapted to transport a substrate, the method comprising:
    transporting the substrate along a nominal transport path past two or more edge sensors to a target location;
    determining robot locations when an edge of the substrate is sensed by the two or more edge sensors;
    determining an initial robot place location offset distance from the nominal transport path based on nominal calibrated sensor locations and the robot locations;
    determining an actual robot place location based on offset calibrated sensor locations corresponding to the initial robot place location offset distance from the nominal transport path; and
    placing the substrate at the target location with the robot located at the actual robot place location,
    wherein multiple offset calibration sensor locations are determined for each sensor based on corresponding multiple calibration paths having multiple offsets from and substantially parallel to the nominal transport path.

7. The method of claim 6 further comprising moving a calibration fixture along the nominal transport path, wherein the two or more edge sensors comprise three edge sensors aligned in a sensor row substantially perpendicular to the nominal transport path and wherein when moving the calibration fixture along the nominal transport path the edge sensors intersect an edge of the calibration fixture at six points forming a hexagon with substantially equal sides.

8. The method of claim 6 further comprising determining the offset calibrated sensor locations of the two or more edge sensors based on averaging robot calibration locations from more than one calibration path offset from and substantially parallel to the nominal transport path.

9. The method of claim 6, wherein determining the actual robot place location comprises defining a minimization function with the actual robot place location defined as a variable within the minimization function and numerically iterating the minimization function by varying the actual robot place location to determine a final robot place location.

10. The method of claim 6 further comprising moving A calibration fixture past the two or more edge sensors along a calibration path offset from and substantially parallel to the nominal transport path by moving the robot with a compound move.

11. An adaptive substrate placement system for placing a substrate at a target location, the placement system comprising:
    a substrate transport robot;
    two or more sensors configured to detect an edge of the substrate as the substrate transport robot moves the substrate along a nominal transport path to the target location; and
    a controller configured to detect robot locations when the edge of the substrate is sensed by the two or more sensors,
    wherein the controller is configured to determine a place location based on the robot locations and the target location, wherein the adaptive substrate placement system is configured to place the substrate at the target location with the robot located at the place location, and wherein the place location is different than the target location, wherein the controller is configured to determine the robot place location by defining a minimization function with a robot place location variable defined as a variable within the minimization function, the solution to which comprises the robot place location.

12. The adaptive substrate placement system of claim 11, wherein the controller is further configured to determine an initial robot place location offset distance from the nominal transport path based on nominal calibrated sensor locations and the robot locations and wherein the controller is further configured to determine the robot place location based on offset calibrated sensor locations corresponding to the initial robot place location offset distance from the nominal transport path.

13. The adaptive substrate placement system of claim 12 wherein the controller is further configured to determine the offset calibrated sensor locations of the two or more edge sensors based on averaging robot calibration locations from more than one calibration paths offset from and substantially parallel to the nominal transport path.

14. The adaptive substrate placement system of claim 12 wherein multiple offset calibration sensor locations are determined for each sensor based on corresponding multiple calibration path having multiple offsets from and substantially parallel to the nominal transport path.

15. The adaptive substrate placement system of claim 11 further comprising a calibration fixture, wherein the controller is configured to move the calibration fixture past the two or more edge sensors along a calibration path offset from and substantially parallel to the nominal transport path, wherein the controller is configured to determine robot calibration locations when an edge of the calibration fixture changes a state of the two or more edge sensors and wherein the controller is configured to determine sensor locations of the two or more edge sensors based on the robot calibration locations.

16. The adaptive substrate placement system of claim 11 wherein the two or more edge sensors comprise three edge sensors aligned in a sensor row nominally perpendicular to the nominal transport path and wherein the controller is configured to move a calibration fixture along the nominal transport path and wherein when moving the calibration fixture along the nominal transport path the edge sensors intersect an edge of the calibration fixture at six points forming a hexagon with substantially equal sides.

17. The adaptive substrate placement system of claim 11 wherein the controller is configured to determine the robot place location by defining a minimization function with a robot place location variable defined as a variable within the minimization function and wherein the controller is configured to numerically iterate the minimization function by varying the robot place location variable to determine the robot place location.

* * * * *